(12) United States Patent
Devta-Prasanna

(10) Patent No.: US 8,412,994 B2
(45) Date of Patent: Apr. 2, 2013

(54) DESIGN-FOR-TEST TECHNIQUE TO REDUCE TEST VOLUME INCLUDING A CLOCK GATE CONTROLLER

(75) Inventor: Narendra B. Devta-Prasanna, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 288 days.

(21) Appl. No.: 12/885,153

(22) Filed: Sep. 17, 2010

(65) Prior Publication Data

US 2012/0072797 A1    Mar. 22, 2012

(51) Int. Cl.
*G01R 31/28* (2006.01)

(52) U.S. Cl. .......... 714/731; 714/726; 714/724

(58) Field of Classification Search ........ 714/731, 714/726, 724
See application file for complete search history.

(56) References Cited

U.S. PATENT DOCUMENTS 6,611,932 B2 *  8/2003  How et al. ............ 714/724
7,840,863 B2 * 11/2010  Grise et al. ........... 714/726
2006/0248417 A1 * 11/2006  Farmer et al. ........ 714/724
2008/0195346 A1    8/2008  Lin et al.
2009/0198461 A1 *  8/2009  Hafed ................... 702/69

OTHER PUBLICATIONS

Motorola Inc, Synopsys Inc.; RTL Low Power Techniques for System-On-Chip Designs; Gladden, et al., 15 pages; 1999.
SNUG San Jose 2004; Power Compiler and DFT Compiler Making them work together—lesson learned; Berkley; 27 pages; Feb. 29, 2004.

* cited by examiner

*Primary Examiner* — Fritz Alphonse

(57) ABSTRACT

Clock control circuitry for an integrated circuit, a method of testing an integrated circuit having a clock gate, an integrated circuit and a library of cells including the clock control circuitry are provided. In one embodiment, the integrated circuit includes: (1) a clock gate configured to apply a clock signal to at least a first scan chain of the integrated circuit, (2) combinational logic coupled to an input of the clock gate and (3) Design-for-Test logic located external to the combinational logic and coupled to the clock gate and a first cell of a second scan chain of the integrated circuit, the Design-for-Test logic configured to control operation of the clock gate based on a logic value of the first cell.

20 Claims, 8 Drawing Sheets

DESIGN-FOR-TEST TECHNIQUE TO REDUCE TEST VOLUME INCLUDING A CLOCK GATE CONTROLLER

TECHNICAL FIELD

This application is directed, in general, to Design-for-Test and, more specifically, to reducing the cost of testing an integrated circuit.

BACKGROUND

Integrated circuits should be tested following manufacture to ensure their proper operation. Design-for-Test is a design technique that adds testability features to the design of integrated circuits to improve the application of manufacturing tests. For this reason, integrated circuits are typically provided with a test access port (TAP) that conforms to Institute of Electrical and Electronics Engineers, Inc., (IEEE) 1149.1, or Joint Test Access Group (JTAG), standard. JTAG specifies a "boundary scanning" technique in which automated test equipment (ATE) connected to the TAP via a JTAG (serial) bus provides a clock signal and one or more patterns of zeroes and ones (a "test pattern") to the integrated circuit and receives a resulting ("output") pattern of responses by the integrated circuit to the test pattern. An output pattern that does not match expectations indicates a failed test. The ATE may analyze the output pattern to determine the nature of the integrated circuit failure and perhaps where in the integrated circuit the failure occurred. Additionally, the ATE may provide signals to direct the testing and operation of the integrated circuit including a scan enable signal.

A tool, such as an Automatic Test Pattern Generation (ATPG) tool, may be used to generate the test patterns. An ATPG tool is used to find a test pattern that, when applied to the integrated circuit, allows a tester to determine between correct circuit behavior and faulty circuit behavior caused by defects. The test patterns generated by the ATPG tool include zeroes and ones (i.e., bits) that are designated as care bits and don't care bits. For example, a test pattern such as X1XXX0 includes two care bits (1 and 0) and four don't care bits as represented by the four "X"s. The logic value of care bits are important since they are used to provide a fault pattern or perform a function for the testing. On the other hand, the logic value of the don't care bits is not critical for testing.

Test patterns can be shifted into scan chains of the integrated circuit as driven by a scan clock signal provided by, for example, an ATE. The scan clock signal can then be stopped and the output patterns can be captured in the scan chains during application of clock pulses (i.e., a capture clock signals). The captured output patterns can then be shifted out of the scan chains as driven by the scan clock signal that is reapplied. The captured output patterns may be provided to the ATE for analysis. A scan chain is a connection of flip-flops in an integrated circuit that can be configured as a shift register and used to receive test patterns to test an integrated circuit. Scan chains may be connected to the ATE via the TAP interface. A clock gate may be used to control application of the scan clock signal and the capture clock signal to certain scan chains of an integrated circuit. Clock gates and clock gating may be used in integrated circuits to control power when the integrated circuits are in the functional mode and, thereby, provide the opportunity to reduce power consumption.

SUMMARY

One aspect provides an integrated circuit. In one embodiment, the integrated circuit includes: (1) a clock gate configured to apply a clock signal to at least a first scan chain of the integrated circuit, (2) combinational logic coupled to an input of the clock gate and (3) Design-for-Test logic located external to the combinational logic and coupled to the clock gate and a first cell of a second scan chain of the integrated circuit, the Design-for-Test logic configured to control operation of the clock gate based on a logic value of the first cell.

In another aspect, a method of testing an integrated circuit having a clock gate is disclosed. In one embodiment, the method includes: (1) applying a scan enable signal to Design-for-Test logic of the integrated circuit to enable the clock gate to provide a scan clock signal, wherein the Design-for-Test logic is coupled to the clock gate and a cell of a scan chain of the integrated circuit and is outside of a functional path of the integrated circuit, (2) shifting, during application of the scan clock signal, a test pattern to the integrated circuit, (3) applying a scan mode signal to the Design-for-Test logic and a logic value to the cell to enable the clock gate to provide a capture clock signal and (4) capturing, during application of the capture clock signal, an output pattern from the integrated circuit that is based on the test pattern.

In yet another aspect, clock control circuitry is disclosed. In one embodiment, the clock control circuitry includes: (1) clock gate logic configured to provide a gated clock signal and (2) Design-for-Test logic coupled to the clock gate logic and configured to control operation of the clock gate logic based on inputs of a scan enable signal, a scan mode signal and a logic value of a scan chain cell of the integrated circuit that is coupled to the Design-for-Test logic.

In still another aspect, a library of standard logic elements is disclosed. In one embodiment, the library includes a single library element of clock control circuitry having clock gate logic and Design-for-Test logic, the clock gate logic configured to provide a gated clock signal and the Design-for-Test logic configured to control operation of the clock gate logic based on inputs of a scan enable signal, a scan mode signal and a logic value of a scan chain cell of the integrated circuit coupled to the Design-for-Test logic.

BRIEF DESCRIPTION

Reference is now made to the following descriptions taken in conjunction with the accompanying drawings, in which.

DETAILED DESCRIPTION

The cost associated with testing an integrated circuit is a significant part of the total manufacturing cost of an integrated circuit. During testing of an integrated circuit having a clock gate or clock gates, operating the clock gates is often needed to provide the clock signal to desired scan chains to shift test patterns therethrough. To operate the clock gates for testing, especially during the capture mode, care bits are typically required in the test patterns generated by the ATPG tools. However, this increases the complexity or the number of test patterns that are needed for testing. By reducing the complexity or the number of test patterns that an ATPG tool produces for a product, the cost of testing can be reduced.

This disclosure provides Design-for-Test logic that is added to an integrated circuit and a method to control the logic circuitry to reduce the number of care bits needed to operate clock gates of the integrated circuit during testing. The disclosed circuitry and method allow an ATPG tool to more easily control clock gates in the integrated circuit that reduces the number of care bits needed to detect a fault. As such, the number of test patterns can be reduced while still providing similar fault coverage and enabling higher compression/compaction of test patterns. The disclosed Design-for-Test logic is located out of the functional paths of the integrated circuit to prevent impact on timing closure of the integrated circuit.

Advantageously, the disclosed Design-for-Test logic may reduce the number of care bits needed for testing, apply to all fault models, have no impact on functional timing and require minimal area overhead. Instead of additional care bits, control signals from an ATPG tool or a JTAG register and a logic value from a scan chain are used to control clock gates through the disclosed Design-for-Test logic. As such, care bits are not needed to enable a capture clock for testing. The control signals can be received from the ATPG via a TAP controller of the integrated circuit.

Disclosed herein are embodiments that are illustrated and described as examples. Though each connector or line may not be illustrated or may not be discussed in the disclosed integrated circuits, one skilled in the art will understand that each embodiment includes the necessary conductors to couple the various components and carry the various signals, data, controls, etc. Additionally, element numbers of similar components may be maintained throughout the various figures.

Figure 1:
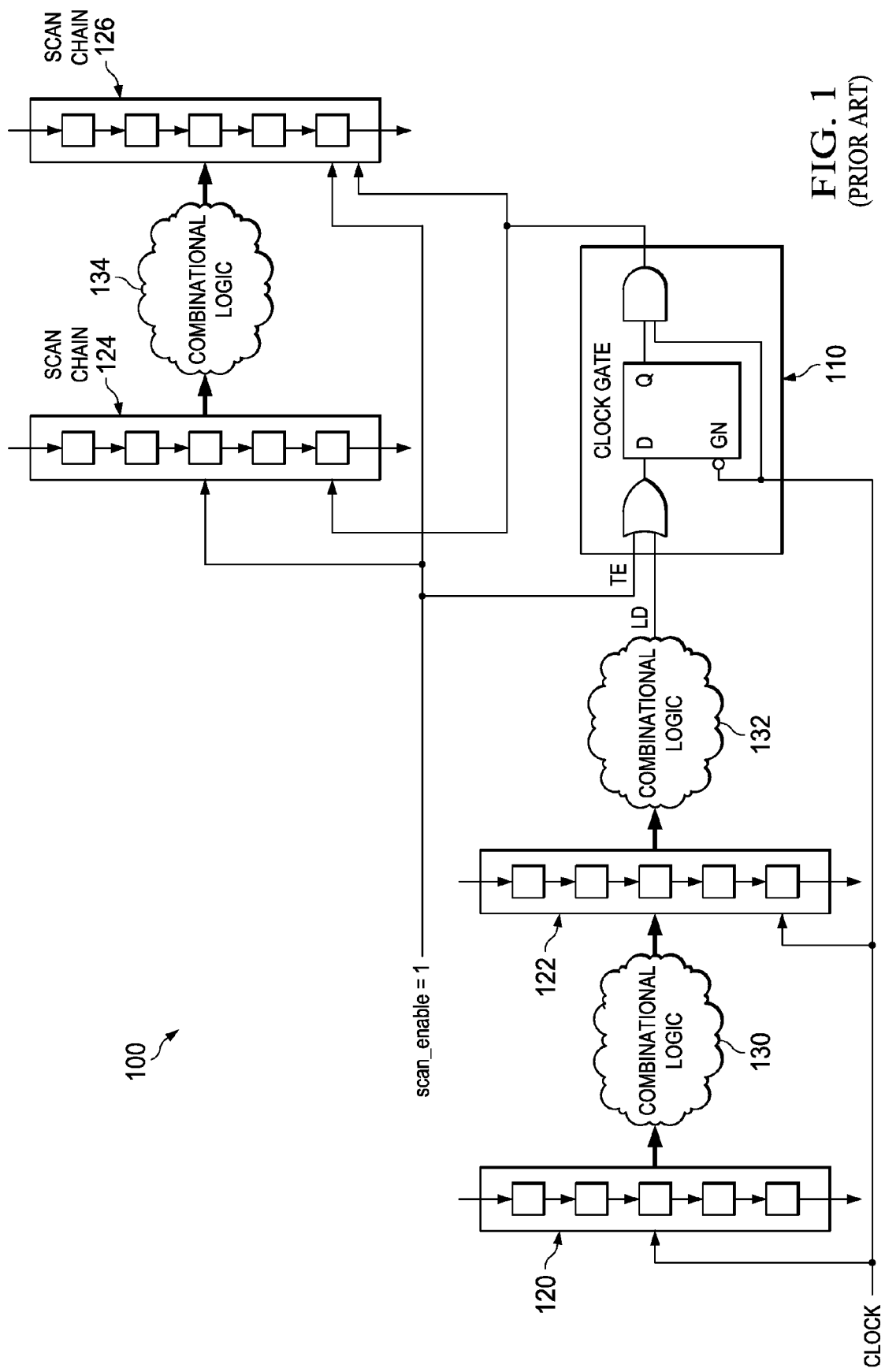
FIG. 1 is a block diagram illustrating a conventional configuration of an integrated circuit including a clock gate and scan chains.

FIG. 1 is a block diagram illustrating a conventional configuration of an integrated circuit 100 including a clock gate 110 and scan chains 120, 122, 124 and 126. The integrated circuit 100 also includes combinational logic 130, 132, 134. One skilled in the art will understand that the integrated circuit 100 may include additional components that are not illustrated but are typically included within an integrated circuit.

The clock gate 110 is configured to control the application of a clock signal to the scan chains 124, 126. The clock signal may be provided by an ATE or via a TAP controller of the integrated circuit 100. During testing, the applied clock signal may be a scan clock signal or a capture clock signal.

The combinational logic 130, 132, 134, is the functional logic of the integrated circuit 100. A functional path traverses the combinational logic of the integrated circuit 100 during the functional mode.

For a typical scan test of an integrated circuit without a clock gate, a scan enable signal is set to a high logic value (e.g., set to one) to shift in a test pattern to the scan chains. The scan enable signal is then set to a low logic value (e.g., zero) and one or more capture clock pulses are applied. The scan enable signal is then again set to the high logic value to shift out the response. To activate and propagate the test pattern through the scan chains and the associated combinational logic of an integrated circuit, care bits are required.

For the integrated circuit 100 including the clock gate 110, a typical scan test is similar with the scan enable signal set to a high logic value to shift in a test pattern to scan chains, such as scan chains 120, 122 and 124. With the scan enable signal set to a high logic value, the TE input (i.e., the test enable input) of the OR gate of the clock gate 110 is high. As such, the clock gate 110 provides the scan clock signal to the scan chains 124, 126. The value of the LD input (i.e., the load input) of the OR gate does not matter at this point. In the scan capture mode, the scan enable signal is set to a low logic value. As such, the TE input of the OR gate of the clock gate 110 is also at the low logic value. Thus, in addition to activating and propagating the test pattern through the scan chains 120, 122, 124, 126, and the associated combinational logic 130, 132, 134, care bits are also needed to enable the capture clock by setting the LD input of the OR gate to a high logic value. Accordingly, in integrated circuits with clock gates, such as the clock gate 110, care bits are needed on two levels for Design-for-Test testing.

With the clock gate 110 enabled through the LD input, one or more capture clock pulses are applied and an output response is captured. The capture clock is then deactivated and the scan enable signal is set to the high logic value to shift out the response. As such, managing clock gating for testing places additional burden on the ATPG tool. In some integrated circuits, the burden may be increased since multiple clock gates may be used.

Figure 2:
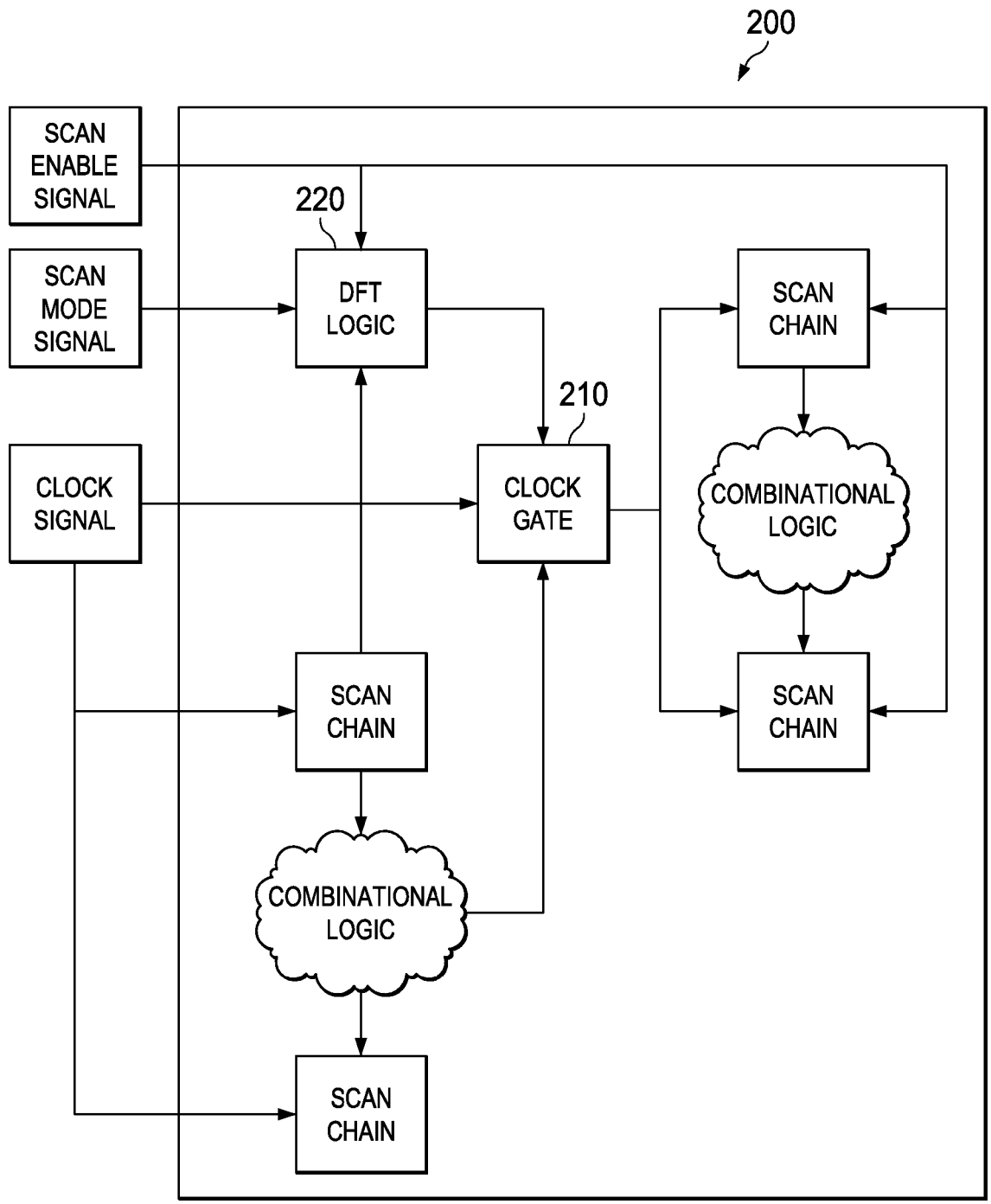
FIG. 2 is a block diagram of an embodiment of an integrated circuit, including Design-for-Test logic, constructed according to the principles of the present disclosure.

FIG. 2 is a block diagram of an embodiment of an integrated circuit 200 constructed according to the principles of the present disclosure. The integrated circuit 200 includes scan chains and combinational logic that may be typically included in an integrated circuit as illustrated in FIG. 1. Additionally, the integrated circuit 200 includes clock gate 210 and Design-for-Test logic 220.

Figure 6:
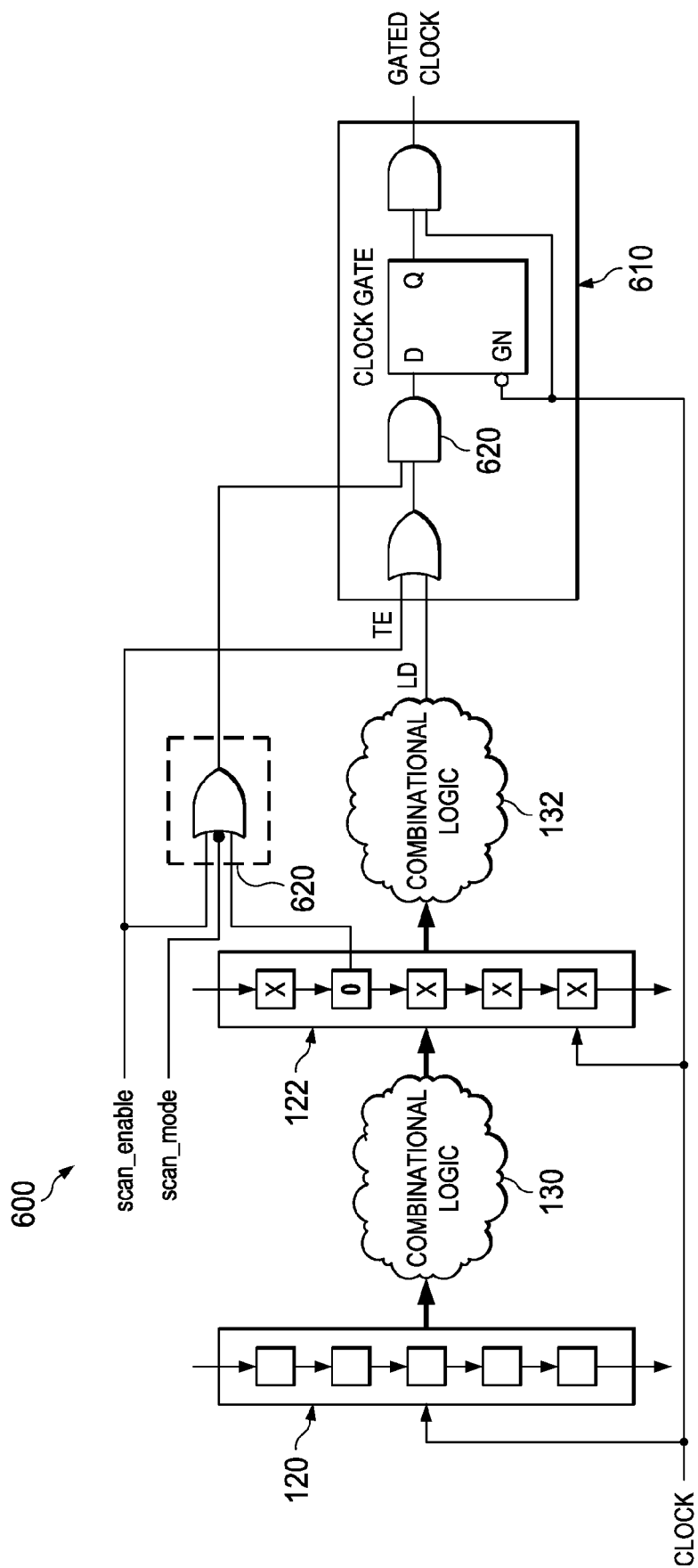
FIG. 6 is a schematic diagram of an integrated circuit including an embodiment of Design-for-Test logic integrated with a clock gate and constructed according to the principles of the present disclosure.
Figure 7:
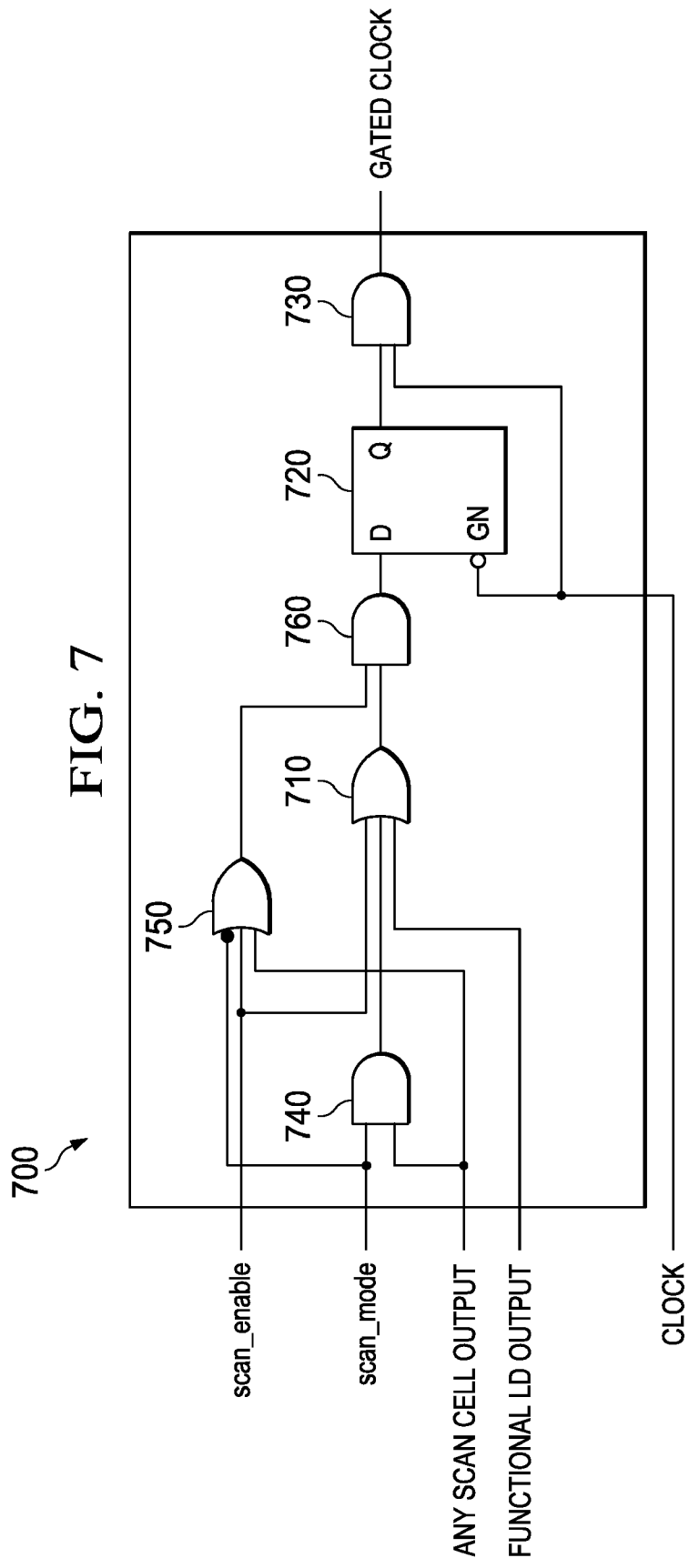
FIG. 7 is a schematic diagram of clock control circuitry for an integrated circuit constructed according to the principles of the present disclosure.

The clock gate 210 may be conventional clock gating logic that is used to control the application of a clock signal in an integrated circuit. In some embodiments, the clock gate 210 may include a portion of the Design-for-Test logic 220. For example, as illustrated in FIG. 6 a portion of the Design-for-Test logic 220 may be integrated with the clock gate 210. In other embodiments, as illustrated in FIG. 7, Design-for-Test logic as disclosed herein and clock gating logic may be integrated as a single library cell.

The Design-for-Test logic 220 is configured to reduce the clock gating burden placed on the ATE. The Design-for-Test logic 220 may include combinational logic that is configured to control operation of the clock gate 210. For inputs, the Design-for-Test logic 220 receives a scan enable signal, a scan mode signal and a logic value. The scan enable signal and the scan mode signal may be received from ATE or via a TAP controller of the integrated circuit. The logic value input is received from a cell (e.g., a flip-flop) of a scan chain. The clock signal applied to the clock gate 210 may also be received from an ATE or another clock gate cell in the integrated circuit. Each of these signals from the ATE may be received via a TAP interface (not illustrated) of the integrated circuit 200.

When in a scan shift mode, the scan enable signal is a high logic value as is typically done with conventional testing. In the scan capture mode, the Design-for-Test logic 220 provides a "short cut" for the ATPG tool to turn on the clock gate 210. With the Design-for-Test logic 220, the ATPG tool does not need to rely on combinational logic to provide a high logic value to the clock gate 210. Instead, the Design-for-Test logic 220 employs a control signal or signals from ATE or a TAP controller of the integrated circuit and the logic value from the scan chain to control the clock gate 210. As such, combinational logic that was formerly needed to provide enable a capture clock can now be tested during scan tests. The control signal may be a scan mode signal. In some embodiments, the control signal may be another signal provided by ATE or a TAP controller of the integrated circuit.

The clock gate 210 may represent multiple clock gates of the integrated circuit 200 that have Design-for-Test logic, such as Design-for-Test logic 220, coupled thereto for control during testing. In some embodiments, Design-for-Test logic may be applied to all clock gates of an integrated circuit design. In other embodiments, clock gates of an integrated circuit design may be ranked using the number of scan cells in the input cone of an LD pin of the clock gate. The top N clock gates from the ranked list may then be selected for Design-for-Test logic. In another method, the clock gates of an integrated circuit may be ranked using the fanout of the output clock. The top N clock gates from this ranked list may then be selected for Design-for-Test logic. Additionally, the multiple clock gates can be ranked based on Sandia Controllability/Observability Analysis Program (SCOAP)-controllability measure of the LD pin and N number of clock gates selected from this ranked list. SCOAP was developed at Sandia National Laboratories in Albuquerque, New Mexico, for the analysis of digital circuit testability. One skilled in the art will understand that other selection schemes for applying the Design-for-Test logic as disclosed herein may also be used.

Various schemes may also be used to select the cell or scan flop for providing the logic value. In one method, a scan cell in the same hierarchy as the clock gate may be randomly selected. In another embodiment, a scan cell in the input cone of the clock gate LD pin may be selected to provide the logic value. Additionally, the SCOAP-controllability measure of the data pin (D pin) of all scan flops in the same hierarchy as the clock gate or in the input cone of the LD pin can be evaluated to determine which scan cell to use. Based on the controllability measure, the scan flop whose data input (D input) is the easiest to control can be selected. Other selection schemes may be used. Additionally, the above schemes may be adjusted to exclude flops that are in critical paths.

Figure 3:
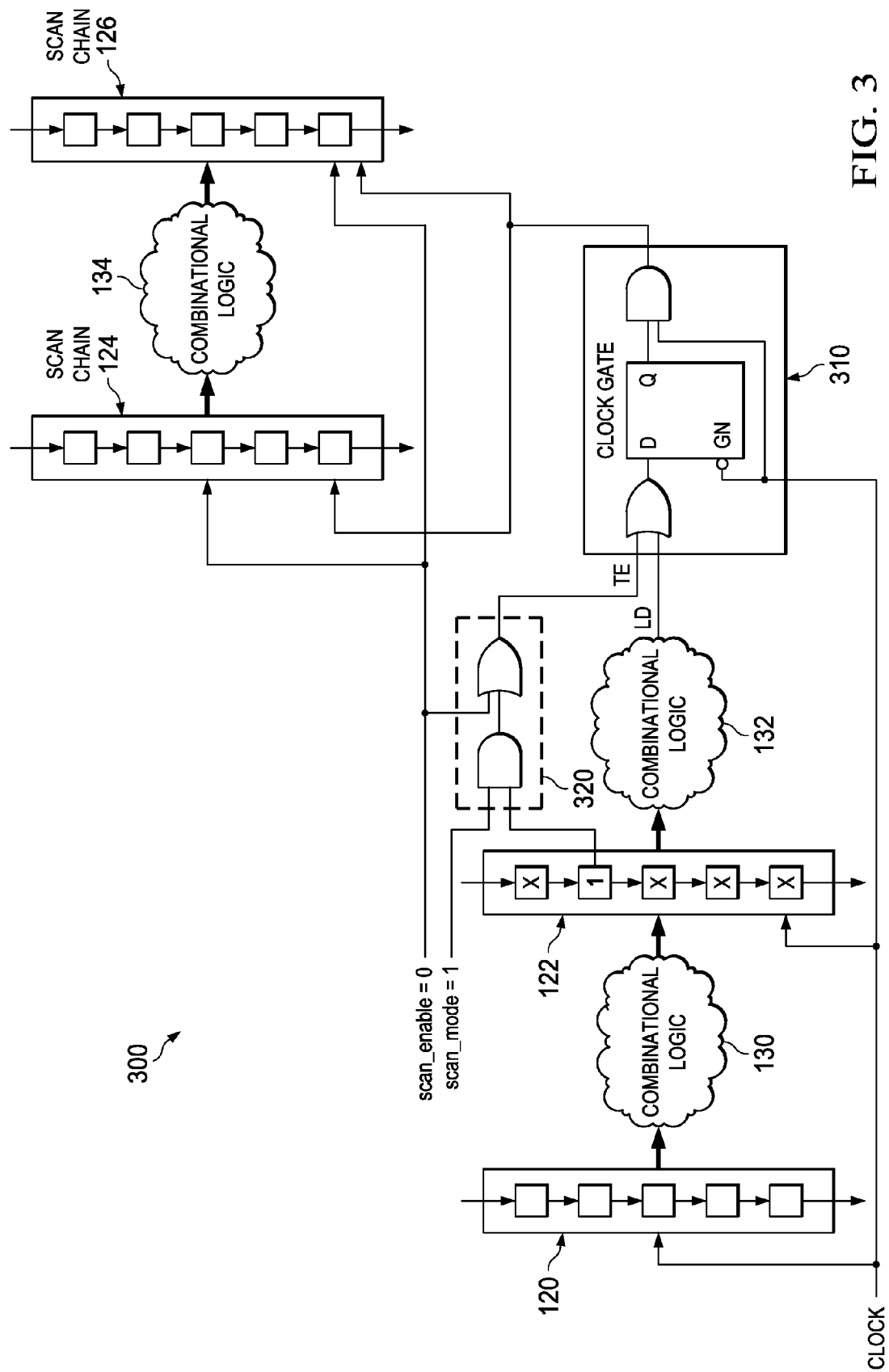
FIG. 3 is a schematic diagram of an integrated circuit including an embodiment of Design-for-Test logic constructed according to the principles of the present disclosure.

FIG. 3 is a schematic diagram of an integrated circuit 300 including an embodiment of Design-for-Test logic 320 constructed according to the principles of the present disclosure. In FIG. 3, the clock gate 310 is embodied as a conventional clock gate having an OR gate, a DQ flip-flop and an AND gate. A first input of the OR gate, the LD input, is coupled to the combinational logic. A second input of the OR gate, the TE input, is coupled to the Design-for-Test logic 320.

The Design-for-Test logic 320 is embodied as an AND gate coupled to an OR gate. In the Design-for-Test logic 320, the AND gate has a first input that is coupled to a scan mode signal and a second input that is coupled to a cell of the scan chain 122. The output of the AND gate is coupled to a first input of the OR gate of the Design-for-Test logic 320. A second input of the OR gate is coupled to the scan enable signal.

In the scan shift mode, the scan enable signal is one, the clock gate 310 is enabled via the Design-for-Test logic 320 and a scan clock signal is provided to the scan chains. In the scan capture mode, the scan enable signal is zero and the scan mode signal is one. Additionally, a logic value of one is provided to the first input of the AND gate from a cell of the scan chain 122. The logic value of one may be provided by a care bit from the ATPG tool. With both inputs of the AND gate of the Design-for-Test logic 320 being high, the Design-for-Test logic 320 provides a high logic output to the TE input of the OR gate of the clock gate 310. As such, the clock gate 310 is enabled and capture clock pulses are provided to the scan chains. Thus, unlike conventional integrated circuits with clock gate circuitry, the integrated circuit 300 can operate the clock gate 310 without making the LD input of the OR gate of the clock gate 310 have a high logic value. This allows testing of the combinational logic 132 and reduces the burden on the ATPG tool. In the functional mode, the scan mode signal is zero and the scan enable signal is zero. Accordingly, the Design-for-Test logic 320 is disabled.

Figure 4:
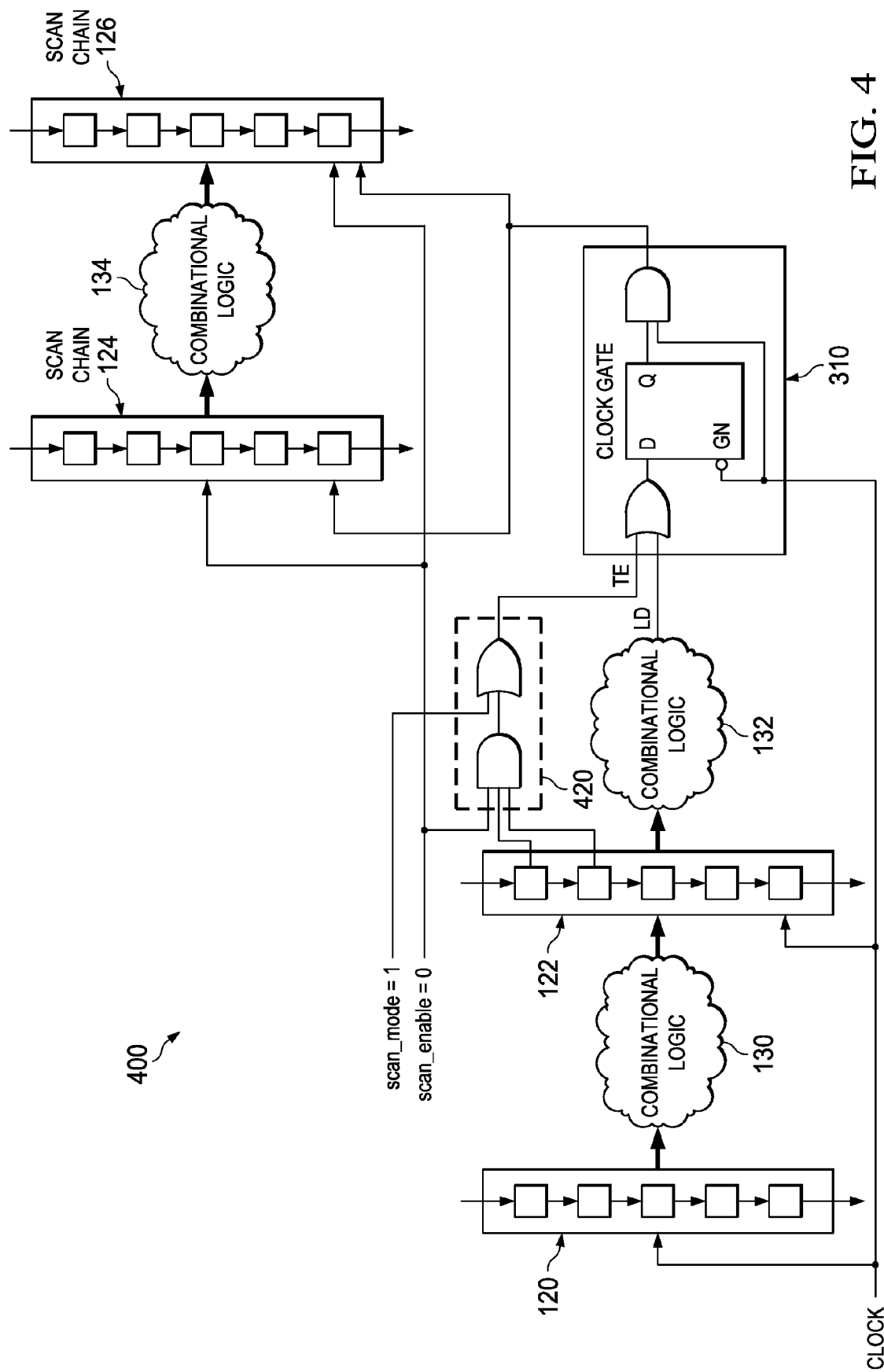
FIG. 4 is a schematic diagram of an integrated circuit including another embodiment of Design-for-Test logic constructed according to the principles of the present disclosure.

FIG. 4 is a schematic diagram of an integrated circuit 400 including another embodiment of Design-for-Test logic 420 constructed according to the principles of the present disclosure. In FIG. 4, the Design-for-Test logic 420 includes an OR gate and an AND gate. Unlike the Design-for-Test logic 320, the OR gate of the Design-for-Test logic 420 includes three inputs. A first input of the OR gate is coupled to a first cell of the scan chain and a second input of the OR gate is coupled to a second cell of the scan chain that is a different cell than the first cell. A third input of the OR gate is coupled to the scan enable signal. In the Design-for-Test logic 420, a first input of the AND gate is coupled to the output of the OR gate and a second input of the AND gate is coupled to the scan mode signal.

In this embodiment, the scan mode signal can be set to a high logic value during the entire scan test. For functional operation, the scan mode signal is set to a low logic value. For the scan shift mode, the scan enable signal is set to a high logic value. In the scan capture mode, the scan enable signal is set to a low logic value and the clock gate 310 can be enabled using either the first or second cell of the scan chain 122.

Figure 5:
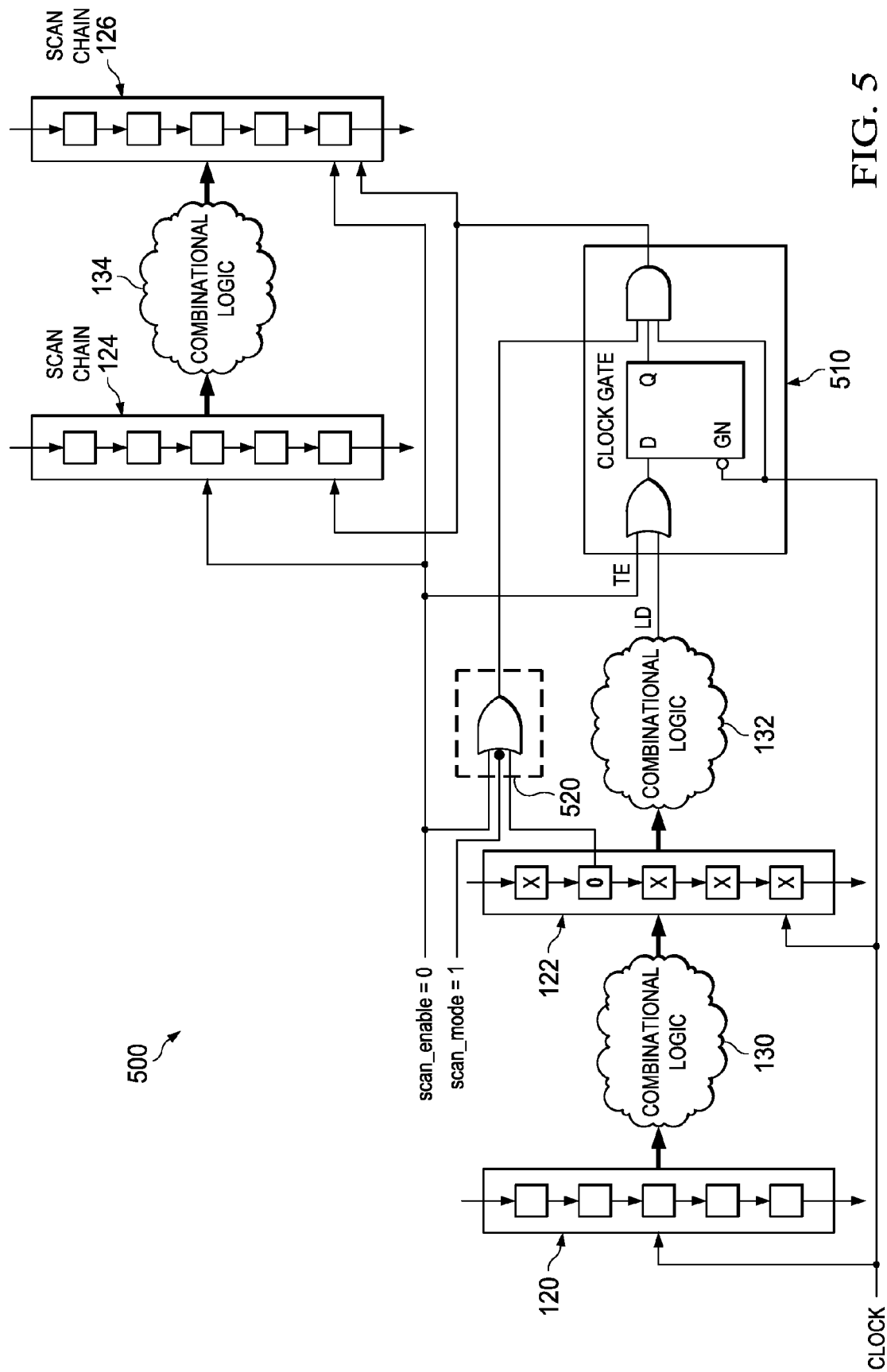
FIG. 5 is a schematic diagram of an integrated circuit including yet another embodiment of Design-for-Test logic constructed according to the principles of the present disclosure.

FIG. 5 is a schematic diagram of an integrated circuit 500 including yet another embodiment of Design-for-Test logic 520 constructed according to the principles of the present disclosure. The integrated circuit 500 also includes a clock gate 510 having an AND gate with three inputs. In FIG. 5, the Design-for-Test logic 520 includes an OR gate that also has three inputs. A first input of the OR gate of the Design-for-Test logic 520 is coupled to a cell of the scan chain 122, a second input, which is inverted, is coupled to the scan mode signal and a third input is coupled to the scan enable signal. For functional mode, the scan mode signal is set to a low logic value, the scan enable signal is a low logic value and the logic value from the scan chain cell does not affect the Design-for-Test logic driving the clock gate cell. In scan mode, whether shifting in or shifting out an output pattern, the scan enable signal is a high logic value and the clock gate 510 is enabled to provide the scan clock signal. In capture mode, the logic value of the cell of scan chain 122 is set to low by a care bit to disable the clock gate 510. In this embodiment of Design-for-Test logic 520, the operation of the 520 Design-for-Test logic helps in reducing power dissipation in the circuit during testing.

FIG. 6 is a schematic diagram of an integrated circuit 600 including an embodiment of a clock gate 610 having a portion of Design-for-Test logic 620 integrated therein and constructed according to the principles of the present disclosure. The clock gate 610 includes an additional AND gate coupled between the OR gate and the flip-flop. The additional AND gate has a first input that is coupled to the output of the OR gate and a second input that is coupled to the output of the Design-for-Test logic 620. The Design-for-Test logic 620 includes an OR gate having three inputs. A first input is coupled to a cell of the scan chain 122, a second input, which is inverted, is coupled to the scan mode signal and a third input is coupled to the scan enable signal. In this embodiment, the operation of the clock gate 610 is controlled without reliance on the LD input of the clock gate 610 in order to disable the clock gate and thus prevent clock signal to propagate to downstream scan cells. This helps in reducing the power consumption in the integrated circuit during test.

FIG. 7 is a schematic diagram of clock control circuitry 700 for an integrated circuit constructed according to the principles of the present disclosure. The clock control circuitry 700 includes combinational logic that is configured to control the application of a clock signal for an integrated circuit. The clock control circuitry 700 includes components that are typically included in a clock gate as discussed above, such as an OR gate 710, a DQ flip-flop 720 and an AND gate 730. With the clock control circuitry 700, Design-for-Test logic for testing is integrated with the clock gate components to form a library cell that can be used in integrated circuit designs for controlling clock signals. The Design-for-Test logic integrated therein includes an AND gate 740, an OR gate 750 and an AND gate 760. In addition to being a schematic, FIG. 7 also represents a portion (i.e., a cell) of a cell library for logic elements. The cell library may also include components illustrated in FIGS. 3, 4, 5 and 6.

The inputs to the clock gate components are the same as in a conventional clock gate: a functional LD input from combinational logic, a clock signal typically from ATE during testing and a scan enable signal that is also typically supplied from ATE during testing. The OR gate 750 also receives the scan enable signal. Additionally, the OR gate 750 includes a scan mode signal (as an inverted input) and a logic value from a scan chain cell. The AND gate 740 includes inputs coupled to the scan mode signal and the scan chain cell. The scan mode signal is typically supplied by the ATE or a TAP controller of the integrated circuit and it is logic high during test. The AND gate 760 receives the output of the OR gate 710 and the OR gate 750. The output of the OR gate 760 is coupled to the D input of the DQ flip-flop 720. With the clock control circuitry 700, the same scan chain cell can be tapped to turn-on and turn-off the clock gate cell without relying on the functional input LD to turn-on or turn-off the clock gate cell. Additionally, the scan mode port can be grounded to disable the Design-for-Test logic.

Figure 8:
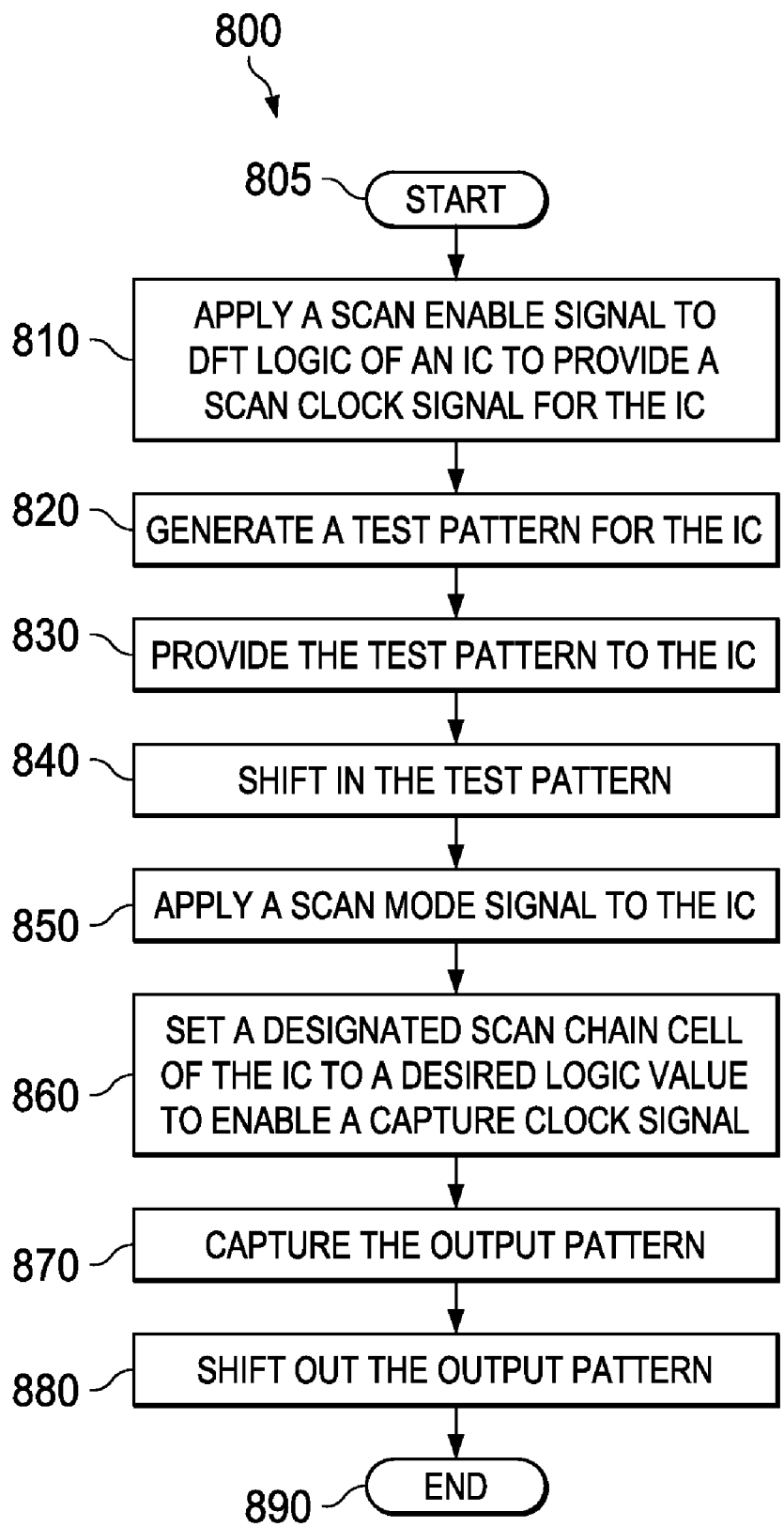
FIG. 8 is a method of testing an integrated circuit carried out according to the principles of the present invention.

FIG. 8 is a method 800 of testing an integrated circuit having a clock gate carried out according to the principles of the present invention. The method 800 begins in a step 805.

In a step 810, a scan enable signal is applied to Design-for-Test logic of the integrated circuit to enable the clock gate to provide a scan clock signal. The Design-for-Test logic is coupled to the clock gate and independent of a functional path of the integrated circuit. The scan enable signal is provided by ATE, coupled to the integrated circuit. The scan enable signal may be applied when asserted high (i.e., having a logic value of one).

A test pattern for the integrated circuit is generated in a step 820. The test pattern includes care bits to activate and propagate a fault for testing the integrated circuit and does not include care bits to activate a capture clock signal for the integrated circuit. The ATPG tool may generate the test pattern.

In a step 830, the test pattern is provided to the integrated circuit. The test pattern may be provided from the ATPG tool to a TAP interface of the integrated circuit. Multiple test patterns may be provided for conducting different tests of the integrated circuit.

During application of the scan clock signal, the test pattern is shifted to the integrated circuit in a step 840. The test pattern may be shifted to a scan chain or multiple scan chains of the integrated circuit by the scan clock signal.

In a step 850, a scan mode signal is applied to the Design-for-Test logic to enable the clock gate to provide a capture clock signal. The scan mode signal may be applied when asserted high In a step 860, a scan chain cell coupled to the Design-for-Test logic is set to a desired logic value to enable the clock gate to provide the capture clock signal. A care bit of the test pattern may be used to set the scan chain cell to the desired logic value (e.g., a high logic value of one). The combination of the inputs from the scan chain cell and the scan mode signal may be used to enable the clock gate to provide the capture clock signal. When the capture clock signal is being applied, the scan enable signal is asserted low (e.g., having a logic value of zero) and the scan clock signal is not being applied (i.e., asserted low). The scan mode signal and the scan enable signal may be applied to the integrated circuit from the ATPG tool.

During application of the capture clock signal, the output pattern from the integrated circuit is captured in a step 870. The output pattern is a result of the application of the test pattern on the integrated circuit.

After being captured, the output pattern is shifted from the integrated circuit in a step 880. The output pattern is shifted upon reapplication of the scan clock signal. The test pattern may be shifted in to a first scan chain of the integrated circuit and the output pattern may be shifted from a second scan chain of the integrated circuit. In some embodiments, the first and second scan chains may be different scan chains. The output pattern may be analyzed using the ATE to determine faults of the integrated circuit. The method 800 ends in a step 890.

Those skilled in the art to which this application relates will appreciate that other and further additions, deletions, substitutions and modifications may be made to the described embodiments.

What is claimed is:

1. An integrated circuit, comprising:
   a clock gate configured to apply a clock signal to at least a first scan chain of said integrated circuit;
   combinational logic coupled to an input of said clock gate; and
   Design-for-Test logic located external to said combinational logic and coupled to said clock gate and a first cell of a second scan chain of said integrated circuit, said Design-for-Test logic configured to control operation of said clock gate based on a logic value of said first cell.

2. The integrated circuit as recited in claim 1 wherein said Design-for-Test logic is further configured to control operation of said clock gate based on at least one control signal from test equipment.

3. The integrated circuit as recited in claim 2 wherein said Design-for-Test logic is configured to operate said clock gate in a scan capture mode based on said scan mode signal and said logic value.

4. The integrated circuit as recited in claim 2 wherein said at least one control signal is a scan mode signal and said Design-for-Test logic includes a first input for receiving said scan mode signal and a second input for receiving said logic value.

5. The integrated circuit as recited in claim 4 wherein said Design-for-Test logic is further configured to control operation of said clock gate based multiple control signals from said test equipment and said Design-for-Test logic further includes a third input for receiving a scan enable signal, wherein said Design-for-Test logic generates a clock gate enable signal at an output to control operation of said clock gate based on values of said first, second and third input.

6. The integrated circuit as recited in claim 5 wherein said output is coupled to a test enable input of said clock gate.

7. The integrated circuit as recited in claim 1 wherein said Design-for-Test logic includes a first input coupled to said first cell of said second scan chain and a second input coupled to a second cell of said second scan chain, wherein said logic value can be in either said first cell or in said second cell.

8. The integrated circuit as recited in claim 1 wherein said Design-for-Test logic is configured to disable said clock gate independent of said combinational logic.

9. The integrated circuit as recited in claim 1 wherein said Design-for-Test logic is located external to said clock gate.

10. The integrated circuit as recited in claim 1 wherein said Design-for-Test logic includes only two logic gates, a first logic gate and a second logic gate, wherein an output of said first logic gate is coupled to an input of said second logic gate.

11. The integrated circuit as recited in claim 1 wherein said Design-for-Test logic only includes a single logic gate.

12. The integrated circuit as recited in claim 1 wherein at least a portion of said Design-for-Test logic is integrated with said clock gate.

13. A method of testing an integrated circuit having a clock gate, comprising:
applying a scan enable signal to Design-for-Test logic of said integrated circuit to enable said clock gate to provide a scan clock signal, wherein said Design-for-Test logic is coupled to said clock gate and a cell of a scan chain of said integrated circuit and is outside of a functional path of said integrated circuit;
shifting, during application of said scan clock signal, a test pattern to said integrated circuit;
applying a scan mode signal to said Design-for-Test logic and a logic value to said cell to enable said clock gate to provide a capture clock signal; and
capturing, during application of said capture clock signal, an output pattern from said integrated circuit that is based on said test pattern.

14. The method as recited in claim 13 further comprising shifting said output pattern from said integrated circuit upon reapplication of said scan clock signal.

15. The method as recited in claim 13 wherein said scan enable signal and said scan mode signal are applied to said integrated circuit from automated test equipment (ATE).

16. The method as recited in claim 13 wherein said Design-for-Test logic is coupled to multiple cells of said scan chain and said logic value is in one of said multiple cells.

17. The method as recited in claim 13 further comprising providing said test pattern to said integrated circuit, wherein said test pattern includes care bits to activate and propagate a fault and does not include care bits to activate said capture clock signal.

18. The method as recited in claim 13 wherein application of said Design-for-Test logic to said clock gate is based on Sandia Controllability/Observability Analysis Program controllability measure of the load input pin of said clock gate and said scan chain cell is selected based on Sandia Controllability/Observability Analysis Program controllability measure of the data pin of said scan chain cell.

19. Clock control circuitry for an integrated circuit, comprising:
clock gate logic configured to provide a gated clock signal; and
Design-for-Test logic coupled to said clock gate logic and configured to control operation of said clock gate logic based on inputs of a scan enable signal, a scan mode signal and a logic value of a scan chain cell of said integrated circuit that is coupled to said Design-for-Test logic.

20. A library of standard logic elements, comprising:
a single library element of clock control circuitry having clock gate logic and Design-for-Test logic, said clock gate logic configured to provide a gated clock signal and said Design-for-Test logic configured to control operation of said clock gate logic based on inputs of a scan enable signal, a scan mode signal and a logic value of a scan chain cell of said integrated circuit coupled to said Design-for-Test logic.

* * * * *